(12) United States Patent
Zou et al.

(10) Patent No.: US 11,406,017 B2
(45) Date of Patent: Aug. 2, 2022

(54) FLEXIBLE PRINTED CIRCUIT BOARD, DISPLAY PANEL, AND DISPLAY DEVICE

(71) Applicant: Wuhan China Star Optoelectronics Technology Co., Ltd., Wuhan (CN)

(72) Inventors: Gonghua Zou, Wuhan (CN); Yucheng Lu, Wuhan (CN); Xiang Yang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/616,453

(22) PCT Filed: May 21, 2019

(86) PCT No.: PCT/CN2019/087695
§ 371 (c)(1),
(2) Date: Nov. 23, 2019

(87) PCT Pub. No.: WO2020/211144
PCT Pub. Date: Oct. 22, 2020

(65) Prior Publication Data
US 2022/0030714 A1    Jan. 27, 2022

(30) Foreign Application Priority Data

Apr. 15, 2019 (CN) .................. 201910300701.X

(51) Int. Cl.
*H05K 1/00* (2006.01)
*H05K 1/11* (2006.01)
*H05K 1/02* (2006.01)

(52) U.S. Cl.
CPC ............. *H05K 1/117* (2013.01); *H05K 1/028* (2013.01); *H05K 2201/09027* (2013.01); *H05K 2201/10128* (2013.01)

(58) Field of Classification Search
CPC .................. H05K 1/117; H05K 1/028; H05K 2201/09027; H05K 2201/10128
See application file for complete search history.

(56) References Cited

U.S. PATENT DOCUMENTS

2015/0228706 A1* 8/2015 Lee ..................... H01L 27/3244
257/88
2017/0171990 A1* 6/2017 Kim ..................... H05K 5/0017
2017/0199414 A1* 7/2017 Guo ....................... H01L 24/13
(Continued)

FOREIGN PATENT DOCUMENTS

CN         1387633 A     12/2002
CN       102763149 A     10/2012
(Continued)

*Primary Examiner* — Pete T Lee
(74) *Attorney, Agent, or Firm* — Nathan & Associates; Nathan Menachem

(57) ABSTRACT

A flexible printed circuit board, a display panel, and a display device are disclosed. The flexible printed circuit board includes a first input portion, and at least a first output portion disposed on the first input portion. The first input portion and the first output portion are disposed at different sides of the flexible printed circuited board. The first output portion includes a plurality of first output terminals, and each of the first output terminals of the first output portion is spaced apart at a different distance from a top end of the first output portion.

15 Claims, 4 Drawing Sheets

(56) References Cited

U.S. PATENT DOCUMENTS

| | | | |
|---|---|---|---|
| 2018/0102083 A1* | 4/2018 | So | G09G 3/2092 |
| 2020/0267842 A1* | 8/2020 | Park | H05K 1/147 |
| 2020/0335429 A1* | 10/2020 | Okaue | H05K 1/189 |

FOREIGN PATENT DOCUMENTS

| | | |
|---|---|---|
| CN | 104134406 A | 11/2014 |
| CN | 106873222 A | 6/2017 |
| JP | 2004118089 A | 4/2004 |
| KR | 20070003394 A | 1/2007 |

\* cited by examiner

FLEXIBLE PRINTED CIRCUIT BOARD, DISPLAY PANEL, AND DISPLAY DEVICE

BACKGROUND OF INVENTION

1. Field of Invention

The present invention relates to a technical field of displays, and particularly to, a flexible printed circuit board, a display panel, and a display device.

2. Related Art

With development of full screens, in order to increase a screen ratio, it is necessary to reduce width of lower boundaries of display screens. As shown in FIG. 1, a current chip on glass (COG) module includes a substrate 10, a display area 11, a driver chip 20 disposed below the display area 11, and a flexible printed circuited board (FPC) 30, wherein a size of a lower frame is composed of a width a of a FPC bonding area, a width between the driver chip and the FPC (a width of wire on area (WOA) area) b, a width c of the driver chip 20, and a width d of fan-out lines of data lines.

However, the frame size of a display panel as described above is relatively large, resulting in a structure developed as shown in FIG. 2. A size of a lower frame of a display panel in FIG. 2 is mainly composed of a width d of fan-out lines of data lines and a width c of a driver chip 20. Further referring to FIG. 3, output terminals 31 of a flexible printed circuit board 30 are connected to pins 21 of the driver chip 20 through connecting lines 32. Though a width of the lower frame is effectively reduced, the connecting lines (WOA lines) 32 are relatively longer. The connecting lines 32 include two perpendicular portions and a horizontal portion, giving rise to a large impedance of the connecting lines. In addition, as number of driver chip pins increases, an impedance of the connecting lines corresponding to the pins closer to inner sides of the driver IC increases, thereby increasing signal attenuation and power consumption.

Therefore, it is imperative to provide a flexible printed circuit board, a display panel, and a display device to overcome the problem existing in current technology.

SUMMARY OF INVENTION

An object of the present invention is to provide a flexible printed circuit board, a display panel, and a display device, capable of reducing power consumption of connecting lines and reducing signal attenuation.

To achieve the above-mentioned technical problem, the present invention provides a flexible printed circuit board, comprising a first input portion; and at least a first output portion disposed on the first input portion, wherein the first output portion is electrically connected to the first input portion, and the first input portion and the first output portion are disposed at different sides of the flexible printed circuited board, wherein the first output portion comprises a plurality of first output terminals, and each of the first output terminals of the first output portion is spaced apart at a different distance from a top end of the first output portion.

The present invention provides a display panel, comprising a display area and a bonding area, wherein the bonding area is configured with a plurality of second input terminals disposed at two sides of the bonding area, each of the second input terminals of at least one of the two sides of the bonding area is spaced apart at a different distance from a lower edge of the bonding area, and the second input terminals are configured to bond the flexible printed circuited board with the display panel.

The present invention further provides a display device comprising the above-mentioned display panel.

The present invention provides a flexible printed circuit board, a display panel, and a display device, wherein the flexible printed circuit board includes a first input portion, and at least a first output portion disposed on the first input portion, wherein the first output portion is electrically connected to the first input portion, and the first input portion and the first output portion are disposed at different sides of the flexible printed circuited board, and wherein the first output portion includes a plurality of first output terminals, and each of the first output terminals of the first output portion is spaced apart at a different distance from a top end of the first output portion. Since each of the first output terminals of the first output portion is spaced apart at a different distance from a top end of the first output portion, a length of the connecting lines can be shortened, thereby lowering an impedance of the connecting lines, and further reducing the power consumption of the connecting lines and signal attenuation.

DESCRIPTION OF PREFERRED EMBODIMENTS

Figure 1:
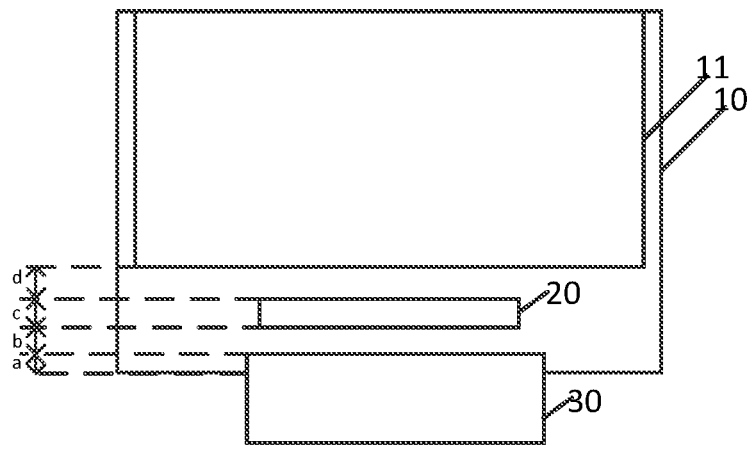
FIG. 1 is a first schematic structural view of a conventional display panel.

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto. The same reference numerals in the drawings denote the same elements.

Figure 4:
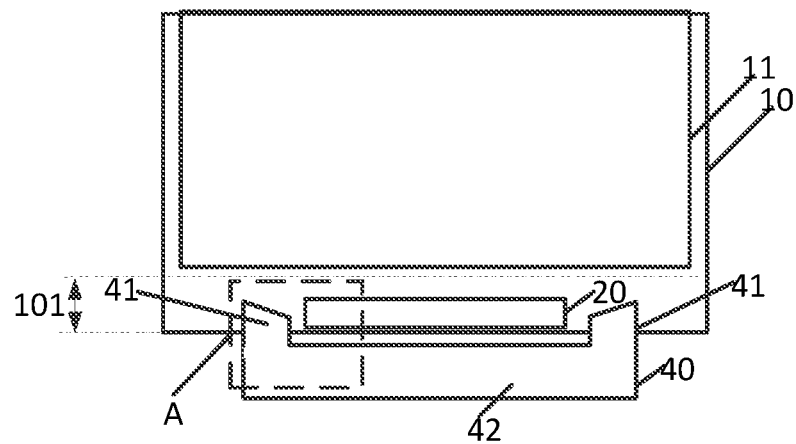
FIG. 4 is a schematic structure view of a display panel of the present invention.

Please refer to FIGS. 4 to 8. FIG. 4 is a schematic structure view of a display panel of the present invention. A flexible printed circuit board 40 of the present invention is provided to connect a driver chip 20 with a printed circuit board (not shown).

The flexible printed circuit board 40 includes two first output portions 41 and a first input portion 42. The first input portion 42 and the first output portions 41 each are disposed at different sides of the flexible printed circuit board. The first input portion 42 includes a plurality of first input terminals (not shown). Certainly, it can be understood that a number of the output portions 41 is not limited to two.

The first output portions 41 are disposed on the first input portion 42 and are electrically connected to the first input portion 42, wherein the two first output portions 41 are disposed at different sides of the flexible printed circuited board 40. Further referring to FIG. 5, the first output portion 41 includes a plurality of first output terminals 43, and each of the first output terminals 43 of at least one of the first output portions 41 is spaced apart at a different distance from a top end of the first output portion 41. For example, from left to right, a distance between each of the first output terminals 43 and the top end of the first output portion 41 is labelled h1 to h6, wherein h1 to h6 is not equal. Certainly, a height between any two of h1 to h6 is required only to be different to each other, and no regular changes is required.

Figure 5:
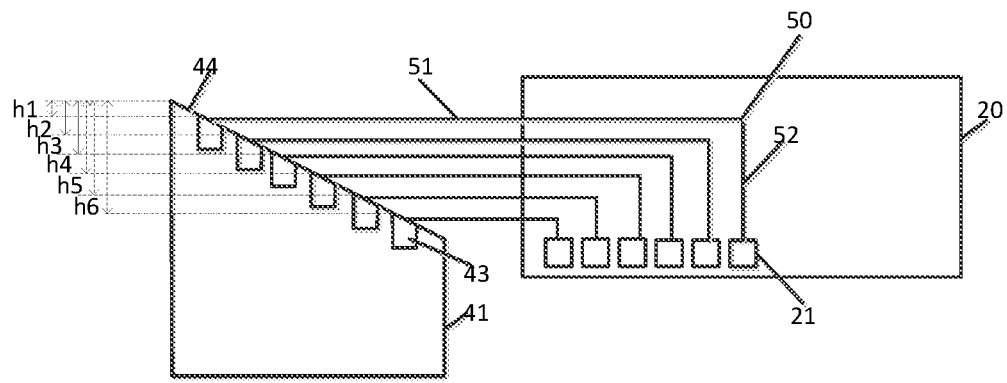
FIG. 5 is a first enlarged view of an A area of FIG. 4.
Figure 6:
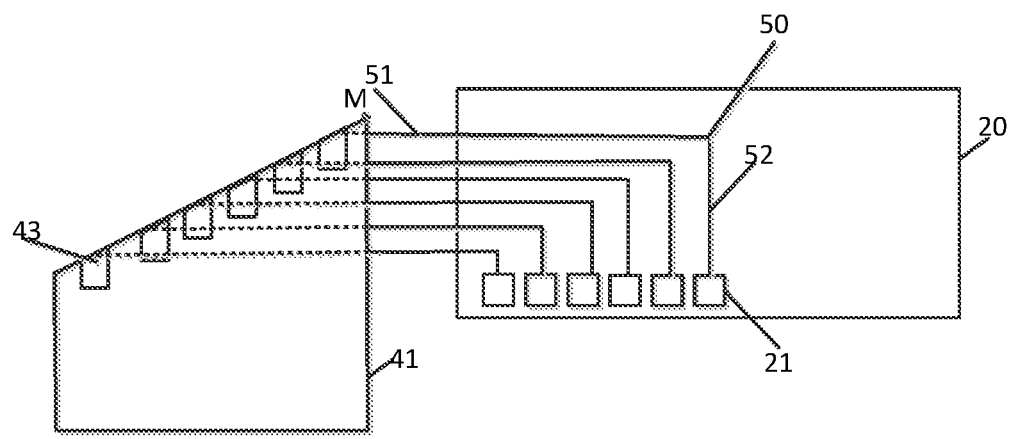
FIG. 6 is a second enlarged view of an A area of FIG. 4.

As shown in FIG. 5 or 6, in order to further reduce a length of the connecting lines, each of the first output terminals 43 of one of the first output portions 41 is spaced apart from the top end (point M) of the first output portion 41 at a distance gradually increases along a predetermined direction. The predetermined direction can be from left to right or from right to left. For example, in one embodiment, in a direction extending to two sides along a geometric center of the driving chip 20, a height of one or two of the first output portions 41 gradually increases. For example, from the middle to the left direction, a height of the first output portion 41 gradually increases, or a height of the first output portion 41 also gradually increases from the middle to the right direction. The first output terminals 43 are disposed on a top portion of the first output portion 41, and thus can simplify a manufacturing process and reduce the manufacturing cost.

The first output portion 41 is electrically connected to the first input portion 42. Please refer to FIGS. 5 to 8. The first output portion 41 is connected to the driver chip 20 through a plurality of connecting lines 50.

In one embodiment, in order to simplify a manufacturing process, the first output portion 41 is right-angled trapezoid in shape, and a top side of the first output portion 41 is inclined with respect to a horizontal line, wherein an angle between the first output portion 41 on a left side and the horizontal line is an obtuse angle, and an angle between the first output portion 41 on a right side and the horizontal line is an acute angle. A lateral side of the first output portion 41 is perpendicular to a bottom side of the first output portion 41, and a top side 44 of the first output portion 41 is inclined to the lateral side of the first output portion 41. Certainly, it can be understood that a shape of the first output portion 41 is not limited to a right-angled trapezoid, and may be others.

In order to further reduce a length of the connecting lines, the first output portion 41 includes the plurality of first output terminals 43, wherein the first output terminals 43 are parallel with each other.

Furthermore, a top side (the uppermost side) of each of the first output terminals 43 is connected to the top side 44 of the first output portion 41. In order to further reduce a length of the connecting lines, in one embodiment, the plurality of the first output terminals 43 are disposed on a top portion of the first output portion 41. For example, a top side of each of the first output terminals is connected to the top side 44 of the first output portion 41, so that the connecting lines adjacent to a side of the flexible printed circuit board in a perpendicular direction can be omitted. It can be understood that the top side 44 of the first output portion 41 may be curved in shape or other shapes, and the top side of each of the first output terminals 43 may be curved in shape or other shape.

In order to improve stability of connection, the top side of the first output terminal 43 is parallel to the top side 44 of the first output portion 41. As shown in FIGS. 5 to 8, in one embodiment, each of the first output terminals 43 is right-angled trapezoid in shape or rectangular in shape. Certainly, the shape of the first output terminal 43 can also be others.

In order to further lower an impedance of the connecting lines, the first input terminals and the first output terminal 43 are connected through wirings, and the wirings are made of one of copper, gold, and silver. The first input terminals and the first output terminals 43 are corresponding to each other.

Figure 2:
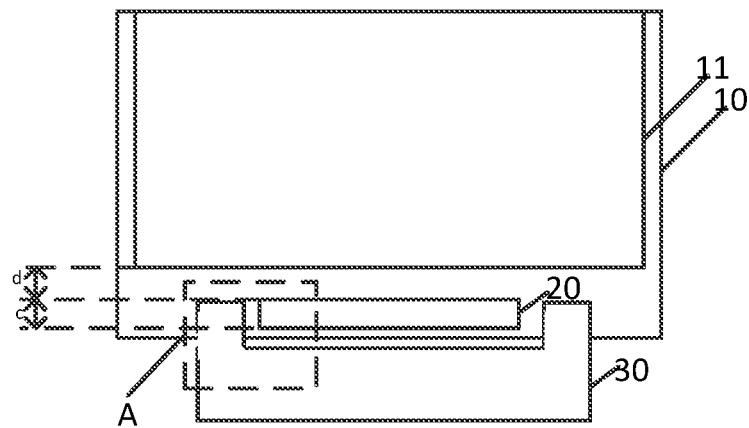
FIG. 2 is a second schematic structural view of a conventional display panel.
Figure 3:
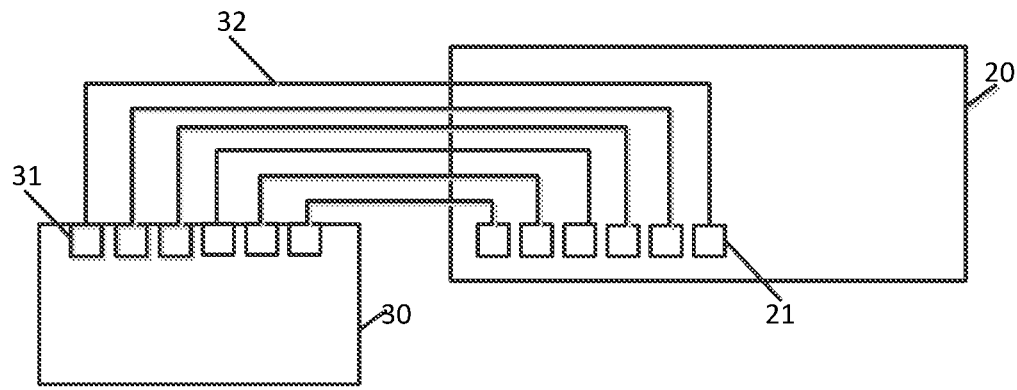
FIG. 3 is an enlarged view of an A area of FIG. 2.

It can be understood that a structure of the first output portion 41 located on the right side of the driving chip 20 is the same as that of the first output portion 41 on the left side. In one embodiment, the two first output portions 41 are symmetrically disposed with respect to a perpendicular line, and details are not reiterated herein. It can be certainly understood that the first output portion 41 located on the right side of the driver chip 20 may has a structure the same as that in FIG. 2.

The flexible printed circuit board is aimed to improve structure of conventional flexible printed circuit boards, that is, each of the first output terminals of at least one of the first output portions is spaced apart at a different distance from a top end of the first output portion. Therefore, the connecting lines adjacent to a side of the flexible printed circuit board in a perpendicular direction can be omitted, thereby reducing a length of the connecting lines and an impedance of the connecting lines, and further reducing the power consumption of the connecting lines and signal attenuation.

Please refer back to FIG. 4. The present invention further provides a display panel including a display area 11 and a bonding area 101, wherein the bonding area 101 is configured with a plurality of second input terminals (not shown) disposed at two sides of the bonding area 101. Each of the second input terminals of at least one of the two sides of the bonding area is spaced apart at a different distance from a lower edge of the bonding area, and the second input terminals are configured to bond the flexible printed circuited board 40 with the display panel. The flexible printed circuit board 40 is any one of the above-mentioned flexible printed circuit boards. Certainly, a maximum height of the first output portion 41 cannot exceed a top end of the bonding area 101.

The display panel may include a driver chip 20, and may further include a substrate 10 on which the display area 11, the driver chip 20, and the flexible printed circuit board 40 are all disposed.

The display area 11 includes a plurality of data lines and scan lines, and the driver chip 20 is electrically connected to the display area 11. For example, the driver chip 20 is connected to the data lines of the display area 11. Please refer to FIGS. 5 to 8. The driver chip 20 includes a plurality of pins 21 connected to the first output terminals 43 through the connecting lines 50. Number of the first output terminals 43 is identical to that of the pins 21. The driver chip 20 may further include access terminals, wherein the access terminals are disposed adjacent to a side of the display area, and the access terminals are connected to the data lines.

Figure 7:
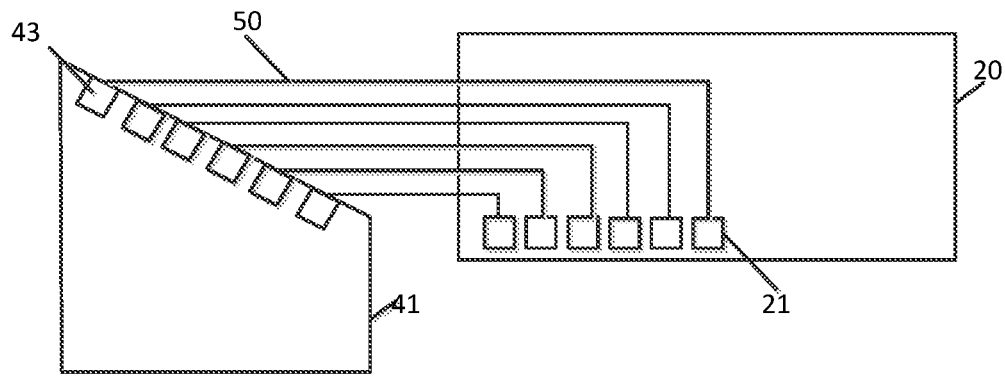
FIG. 7 is a third enlarged view of an A area of FIG. 4.

As shown in FIGS. 5 to 7. Each of the connecting lines 50 includes a horizontal portion 51 and a vertical portion 52 that are connected to each other, wherein the other end of the horizontal portion 51 is connected to the first output terminal 43, and the other end of the vertical portion 52 is connected to the pin 21. In one embodiment, each of the connecting lines 50 has an inverted L shape. In certain embodiments, the connecting lines 50 and bonding terminals on the substrate may be distributed in different metal layers. For example, as shown in FIG. 6, the connecting lines 50 are formed on a metal layer under the bonding terminals, and are running to a metal layer where the bonding terminals are located through via holes, thereby to avoid short circuits occurred between the connecting lines where the bonding terminals are located for the flexible printed circuit board.

Figure 8:
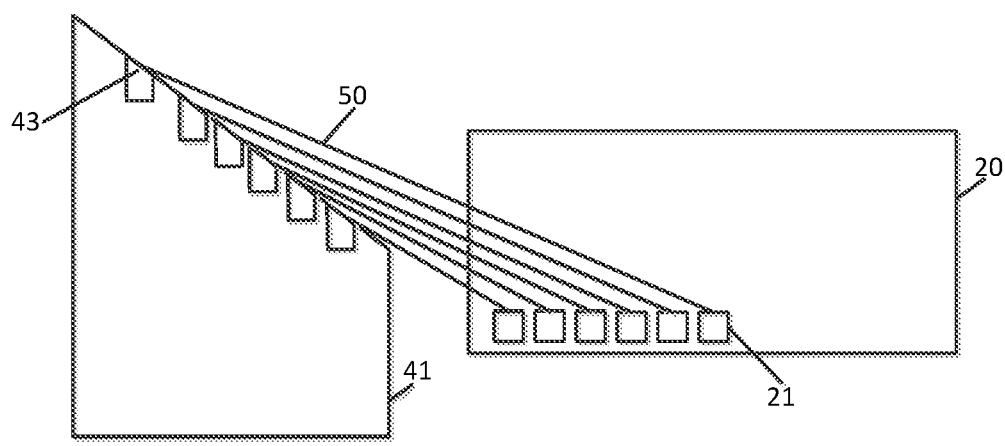
FIG. 8 is a fourth enlarged view of an A area of FIG. 4.

As shown in FIG. 8, the connecting lines 50 are obliquely disposed with respect to a horizontal line.

In order to further reduce power consumption and attenuation of high frequency signals, an impedance of the connecting lines 50 is greater than that of wirings of the flexible printed circuit board 40. In one embodiment, the connecting lines 50 each include a cross-sectional structure having molybdenum (Mo), aluminium (Al), and Mo. The wirings of the flexible printed circuit board are made of one of copper, gold, and silver The present invention further provides a display device including the above-mentioned display panel. The display device may include a backlight module.

The present invention provides a flexible printed circuit board, a display panel, and a display device, wherein the flexible printed circuit board includes a first input portion, and at least a first output portion disposed on the first input portion, wherein the first output portion is electrically connected to the first input portion, and the first input portion and the first output portion are disposed at different sides of the flexible printed circuited board, and wherein the first output portion includes a plurality of first output terminals, and each of the first output terminals of the first output portion is spaced apart at a different distance from a top end of the first output portion. Since each of the first output terminals of the first output portion is spaced apart at a different distance from a top end of the first output portion, a length of the connecting lines can be shortened, thereby lowering an impedance of the connecting lines, and further reducing the power consumption of the connecting lines and signal attenuation.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A flexible printed circuit board, comprising:
a first input portion; and
at least a first output portion disposed on the first input portion, wherein the first output portion is right-angled trapezoid in shape, a top side of the first output portion is inclined with respect to a horizontal line, the first output portion is electrically connected to the first input portion, and the first input portion and the first output portion are disposed at different sides of the flexible printed circuited board, wherein the first output portion comprises a plurality of first output terminals, and each of the first output terminals of the first output portion is spaced apart at a different distance gradually increasing in a predetermined direction from a top end of the first output portion.

2. The flexible printed circuited board of claim 1, wherein a top side of each of the output terminals is parallel with the top side of the first output portion.

3. The flexible printed circuited board of claim 2, wherein each of the first output terminals is right-angled trapezoid in shape or rectangular in shape.

4. The flexible printed circuited board of claim 1, wherein the first input portion comprises a plurality of first input terminals each connected to the first output terminals through wirings, and the wirings are made of one of copper, gold, and silver.

5. A display panel, comprising:
a display area and a bonding area, wherein the bonding area is configured with a plurality of second input terminals disposed at two sides of the bonding area, each of the second input terminals of at least one of the two sides of the bonding area is spaced apart at a different distance from a lower edge of the bonding area, and the second input terminals are configured to bond a flexible printed circuited board with the display panel;
wherein a driver chip is disposed on the bonding area, and the driver chip comprises a plurality of pins connected to the first output terminals through connecting lines.

6. The display panel of claim 5, wherein the flexible printed circuit board comprises:
a first input portion; and
at least a first output portion disposed on the first input portion, wherein the first output portion is electrically connected to the first input portion, and the first input portion and the first output portion are disposed at different sides of the flexible printed circuited board, wherein the first output portion comprises a plurality of first output terminals, and each of the first output terminals of the first output portion is spaced apart at a different distance from a top end of the first output portion.

7. The display panel of claim 6, wherein each of the first output terminals of the at least one of first output portion is spaced apart from the top end of the first output portion at a distance gradually increases in a predetermined direction.

8. The display panel of claim 6, wherein the first output portion is right-angled trapezoid in shape, and a top side of the first output portion is inclined with respect to a horizontal line.

9. The display panel of claim 8, wherein a top side of each of the output terminals is parallel with the top side of the first output portion.

10. The display panel of claim 9, wherein each of the first output terminals is right-angled trapezoid in shape or rectangular in shape.

11. The display panel of claim 5, wherein the first output terminals are disposed at two sides of the pins.

12. The display panel of claim 5, wherein the connecting lines have an impedance greater than that of wirings of the flexible printed circuit board.

13. The display panel of claim 12, wherein the connecting lines each comprise a cross-sectional structure comprising molybdenum (Mo), aluminium (Al), and Mo, and the wirings of the flexible printed circuit board are made of one of copper, gold, and silver.

14. A display device, comprising:
a display area and a bonding area, wherein the bonding area is configured with a plurality of second input terminals disposed at two sides of the bonding area, each of the second input terminals of at least one of the two sides of the bonding area is spaced apart at a different distance from a lower edge of the bonding area, and the second input terminals are configured to bond a flexible printed circuited board with a display panel;
wherein the flexible printed circuit board comprises:
a first input portion; and
at least a first output portion disposed on the first input portion, wherein the first output portion is right-angled trapezoid in shape, a top side of the first output portion is inclined with respect to a horizontal line, the first output portion is electrically connected to the first input portion, and the first input portion and the first output portion are disposed at different sides of the flexible printed circuited board, wherein the first output portion comprises a plurality of first output terminals, and each of the first output terminals of the first output portion is spaced apart at a different distance from a top end of the first output portion.

15. The display device of claim 14, wherein each of the first output terminals of the at least one of first output portion is spaced apart from the top end of the first output portion at a distance gradually increases in a predetermined direction.

\* \* \* \* \*